United States Patent [19]
Furuta

[11] Patent Number: 5,416,661
[45] Date of Patent: May 16, 1995

[54] SEMICONDUCTOR INTEGRATED CIRCUIT DEVICE

[75] Inventor: Hiroshi Furuta, Tokyo, Japan

[73] Assignee: NEC Corporation, Tokyo, Japan

[21] Appl. No.: 19,693

[22] Filed: Feb. 19, 1993

[30] Foreign Application Priority Data

Feb. 21, 1992 [JP] Japan .................................. 4-072524

[51] Int. Cl.⁶ ............................................. H02H 3/20
[52] U.S. Cl. ...................................... 361/56; 361/91; 361/111; 361/118
[58] Field of Search ................... 361/56, 91, 111, 119, 361/118; 307/296.6, 296.8

[56] References Cited

U.S. PATENT DOCUMENTS 4,847,724 7/1989 Renous .................................. 361/91
5,063,304 11/1991 Iyengar ............................ 307/296.6

OTHER PUBLICATIONS

Furuyama et al., "A New On-Chip Voltage Converter for Submicrometer High-Density DRAM's", *IEEE Journal of Solid-State Circuits*, vol. SC-22, No. 3, Jun. 1987, pp. 437-440.
J. Rissanen, Universal coding, information, prediction, and estimation, IEEE Transaction on Information Theory (Jul. 1984).
J. Rissanen, G. G. Langdon, Universal modeling and coding, IEEE Transaction on Information Theory (Jan. 1981).
J. Rissanen, A universal state compression system, IEEE Transaction on Information Theory (Sep. 1983).
J. Ziv, A. Lempel, A universal algorithm for sequential data compression, IEEE Transactions On Information Theory (May 1977).
J. Ziv, A. Lempel, Compression of Individual Sequences Via Variable-Rate Coding, IEEE Transactions on Information Theory, Sep. 1978.
T. Bell, A Unifying Theory and Improvements for Existing Approaches to Text Compression, University of Canterbury, 1986.

*Primary Examiner*—Marc S. Hoff
*Assistant Examiner*—S. Jackson
*Attorney, Agent, or Firm*—Burns, Doane, Swecker & Mathis

[57] ABSTRACT

A semiconductor integrated circuit device is equipped with a built-in power supply voltage conversion circuit which converts an external power supply voltage into an internal, lower voltage and supplies the internal voltage to internal circuits, and a clamping element which is inserted between an external power supply wiring connected to an external power supply pin and at least one of an input pin and an internal power supply wiring serving as an output line of the power supply voltage conversion circuit. As a result of distribution of electric charge to the capacitor formed between the internal power supply wiring and the substrate due to operation of the clamping element caused by the application of an overvoltage, it is possible to obtain an electrostatic withstand voltage comparable to that of a semiconductor integrated circuit device which lacks a built-in power supply voltage conversion circuit.

9 Claims, 8 Drawing Sheets

SEMICONDUCTOR INTEGRATED CIRCUIT DEVICE

BACKGROUND OF THE INVENTION

The present invention relates to a semiconductor integrated circuit device (IC) and more particularly to a semiconductor integrated circuit device which has a built-in power supply voltage conversion circuit.

In a semiconductor integrated circuit device, especially in a MOS integrated circuit device, degradation in reliability of a MOSFET due to hot carriers is becoming of concern accompanying the progress in refinement of the device geometry. For an IC using a MOSFET having channel length smaller than 0.8 μm, it has become necessary to suppress the generation of hot carriers by setting the operating voltage to be below 5 V. As a result, use is being made of an IC (referred to as LVIC hereinafter) in which its internal circuits are driven at 3.3 V by lowering an external voltage (5 V) using a power supply voltage conversion circuit (V.C.) inside the IC, by taking the interface with a system employing the IC into account.

In an LVIC a sufficient electrostatic withstand voltage cannot be achieved even if electrostatic breakdown preventive measures similar to those for an IC having no built-in V.C. are implemented. In particular, the electrostatic withstand voltage between an external power supply pin and an input or output pin is unsatisfactory.

SUMMARY OF THE INVENTION

Accordingly, it is the object of this invention to provide an LVIC which has an electrostatic withstand voltage equivalent to that of an IC having no built-in V.C.

A semiconductor integrated circuit device according to this invention has a power supply voltage conversion circuit between an external power supply wiring and a ground wiring. This power supply voltage conversion circuit converts the external power supply voltage supplied between an external power supply pin and a grounding pin to a lower internal power supply voltage, and supplies it between an internal power supply wiring and ground wiring. Internal circuits are connected between the internal power supply wiring and the ground wiring. A first protective circuit is connected between the ground wiring and an input pad which supplies an input signal to the internal circuits. A second protective circuit is inserted between the internal power supply wiring and at least either one of the external power supply wiring or the input pad. The second protective circuit inserted between the external power supply wiring and the internal power supply wiring includes a clamping element which clamps the potential of the internal power supply wiring if a high voltage positive with respect to the input pad is applied to the external power supply pin connected to the external power supply wiring. In this way it is possible to obtain an electrostatic withstand voltage (external power supply pin versus input pin) comparable to that of an IC which does not have a built-in V.C. In addition, the second protective circuit inserted between the input pin and the internal power supply wiring includes a clamping element which clamps the potential of the internal power supply wiring if a high voltage positive with respect to the external power supply pin or another input pin is applied to one of the input pins. In this way it is possible to obtain an electrostatic withstand voltage (input pin versus external power supply pin and input pin versus input pin) comparable to that of an IC which does not have a built-in V.C.

BRIEF DESCRIPTION OF THE DRAWINGS

The above-mentioned and other objects, features, and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
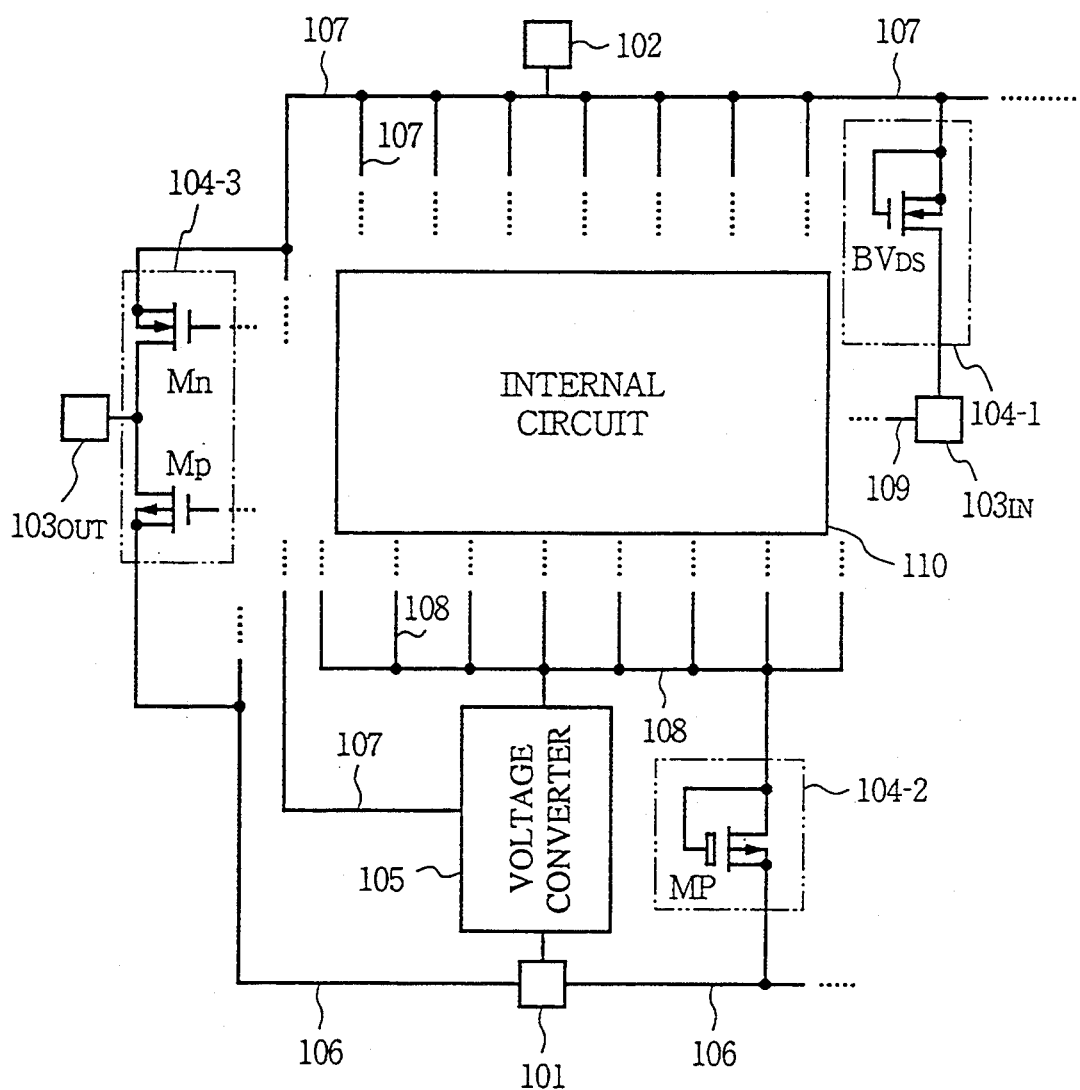
FIG. 1 is a connection diagram schematically showing a first embodiment of the invention.

Referring to FIG. 1, the first embodiment of this invention shown in the figure has, as a clamping element, a protective circuit 104-2 consisting of a P-channel MOSFET MP connected between an external power supply wiring 106 and an internal power supply wiring 108. The P-channel MOSFET MP is a field transistor having a two-layer film (not shown) consisting of a field oxide film (with thickness 500 nm, for example) and an interlayer insulating film (with thickness 1 μm, for example) as a gate oxide film, and its gate electrode is connected to the internal power supply wiring 108.

An external power supply pad 101 (connected to an external power supply pin by a bonding wire) is connected to the external power supply wiring 106. The external power supply wiring 106 is provided so as to nearly surround the periphery of the semiconductor chip.

A grounding pad 102 (connected to a grounding pin by a bonding wire) is connected to a ground wiring 107. The ground wiring 107 is branched in various ways to be connected to elements constituting the IC.

A voltage converter (V.C.) 105 converts a power supply voltage of 5 V applied between the external power supply pad 101 and the grounding pad 102 to a voltage of 3.3 V, and supplies it to the internal power supply wiring 108. The internal power supply wiring 108 is branched in various ways to be connected to elements constituting the IC. An internal circuit 110 includes a logic circuit consisting of a CMOS connected between the internal power supply wiring 108 and the ground wiring 107.

A protective circuit 104-3 serving also as an output circuit of the LVIC has a P-channel MOSFET Mp and an N-channel MOSFET Mn inserted between an output pad $103_{OUT}$ and the external power supply wiring 106 and the ground wiring, respectively. Although only one output circuit is shown explicitly in the figure, needless to say there are in reality a plurality of circuits with similar constitution.

Between an input pad $103_{IN}$ and the ground wiring 107 there is inserted an N-channel MOSFET $BV_{DS}$ to form a protective circuit 104-1. The N-channel MOSFET $BV_{DS}$ has a gate oxide film with the same thickness as that of the MOSFET that constitutes the internal circuit 110, and its gate electrode is connected to the ground wiring. Although only one input pad is shown in the figure, in reality there are a plurality of the circuits with similar constitution, needless to say.

Figure 2:
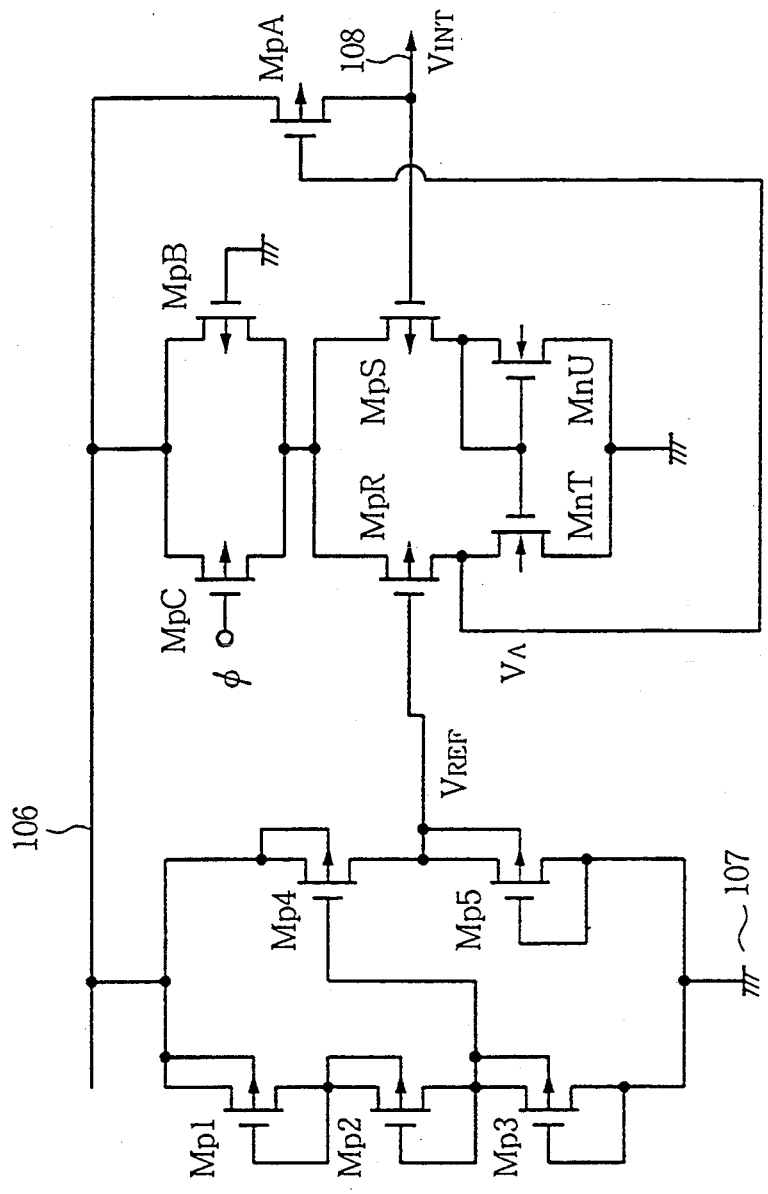
FIG. 2 is a circuit diagram of V.C. employed in the first embodiment.

Next, referring to FIG. 2, V.C. 105 will be described. This circuit is discussed in IEEE Journal of Solid-State Circuits, Vol. SC-22, No. 3, June 1987, pp. 437–440.

The gate voltage of a P-channel MOSFET Mp4 is determined by a circuit formed by connecting in series three P-channel MOSFETs MP1, Mp2 and Mp3, with each gate electrode connected to its drain. A reference voltage VREF (3.3 V) is determined by the equivalent resistance of the P-channel MOSFETs Mp4 and Mp5. P-channel MOSFETs MpR and MpS and N-channel MOSFETs MnT and MnU form a current mirror amplifier, and compares the reference voltage $V_{REF}$ and an output Voltage $V_{INT}$. If $V_{INT}$ is higher (or lower) than $V_{REF}$, the drain voltage $V_A$ of MnT goes down (or up), and with a change in the operating point of the P-channel MOSFET MpA, VINT also goes down (or up). In this manner, the internal power supply voltage $V_{INT}$ which is the same voltage as the reference voltage $V_{REF}$ is obtained. At the time of standby a gate-grounded P-channel MOSFET MpB alone is operated. A P-channel MOSFET MpC is driven by clock $\phi$, and is not energized at the time of standby.

Figure 3:
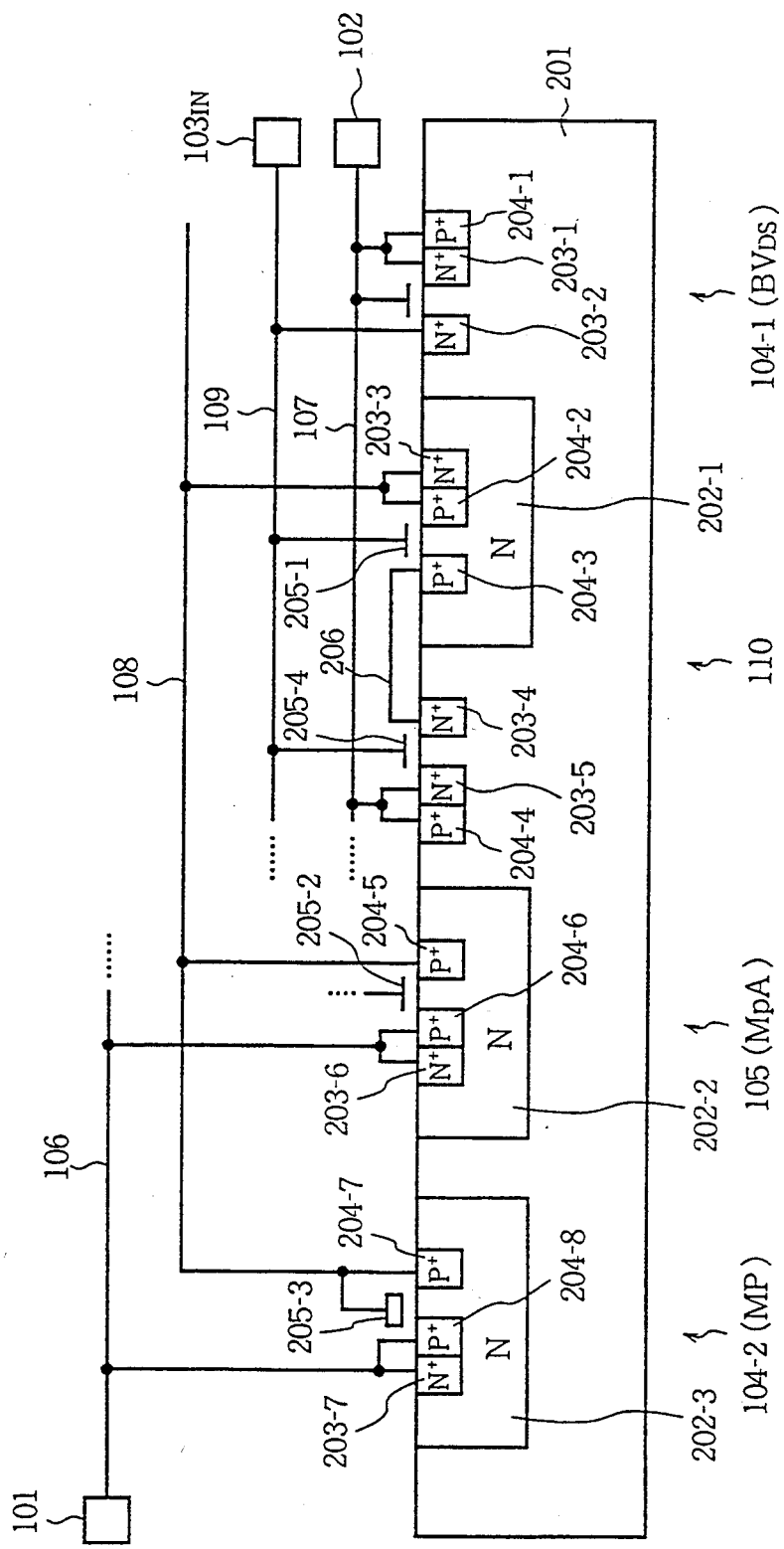
FIG. 3 is a schematic sectional diagram of a semiconductor chip for explaining the first embodiment.

Referring also to FIG. 3, the first embodiment of the invention has N-channel MOSFETs formed on the surface part of a P-type silicon substrate, and P-channel MOSFETs formed on the surface part of N wells 202.

The protective circuit 104-1 has $N^+$-type diffused layers 203-1 and 203-2 as source and drain regions, and a substrate contact region 204-1. In addition, the protective circuit 104-2 has $P^+$-type diffused layers 204-7 and 204-8 formed on the surface part of an N well 202-3 as the source and drain regions, and an $N^+$-type diffused layer 203-7 as a well contact region. The reference symbol 205-3 represents the gate electrode of MP. In an N well 202-2 there is shown as a representative of V.C. 105, a P-channel MOSFET MpA consisting of $P^+$-type diffused layers 204-5, and 204-6, an $N^+$-type diffused layer 203-6, and a gate electrode 205-2. In an N well 202-1 there is formed a P-channel MOSFET (internal circuit) consisting of an $N^+$-type diffused layer 203-3, $P^+$-type diffused layers 204-2 and 204-3, and a gate electrode 205-1. An N-channel MOSFET shown as a representative internal circuit, which forms a CMOS inverter together with the above-mentioned P-channel MOSFET, has $N^+$-type diffused layers 203-4 and 203-5, a $P^+$-type diffused layer 204-4, and a gate electrode 205-4. The $N^+$-type diffused layer 203-4 and the $P^+$-type diffused layer 204-3 are connected by a wiring 206.

An electrostatic withstand voltage test given to the first embodiment by applying an overvoltage which is positive with respect to the input pad $103_{IN}$ to the external power supply pad 101, produced an excellent result. Namely, there was obtained an electrostatic withstand voltage equivalent to that of an IC in which the external pad 101 is connected to the internal power supply wiring 108 without intermediary of the V.C. 105. The reason for this can be explained as follows.

Figure 4:
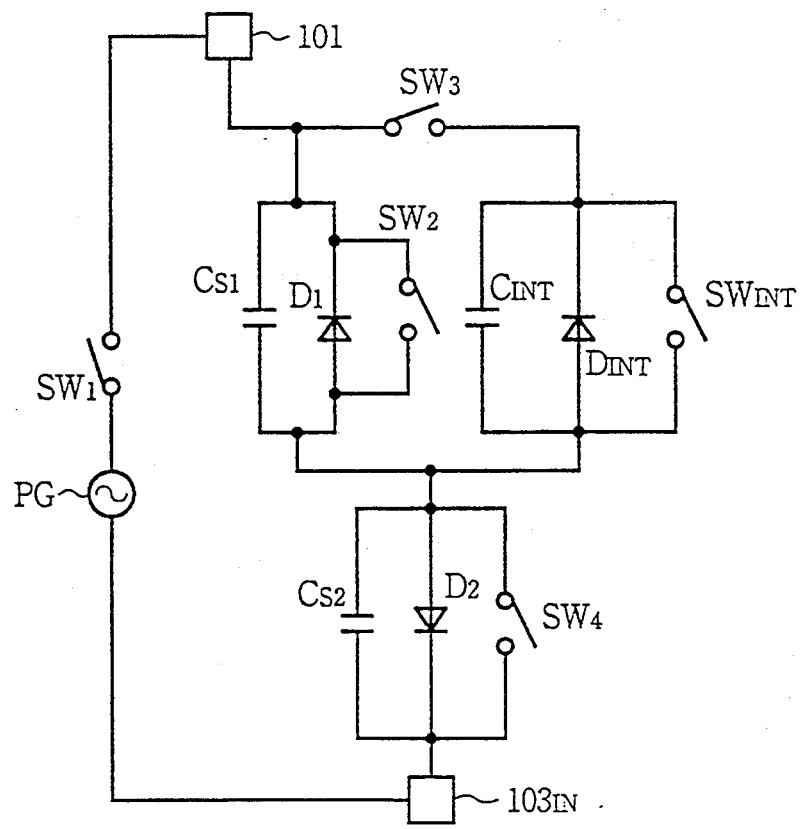
FIG. 4 is an equivalent circuit diagram for the first embodiment of the time of electrostatic withstand voltage test.

Referring to FIG. 4, in the equivalent circuit shown by the figure, $SW_1$ is a switch to be closed when an electrostatic pulse PG is applied. A capacitor CS1 is the equivalent capacity between the external power supply wiring 106 and the P-type silicon substrate 201, $D_1$ is the P-N junction diode formed by N wells and the P-type silicon substrate 201, and $SW_2$ is a switch for indicating that $D_1$ underwent breakdown when it is closed, $SW_3$ is a switch for indicating that the clamping element MP is operated when it is closed.

$C_{INT}$ and $D_{INT}$ are the capacity and the P-N junction diode, respectively, which the internal power supply wiring 108 has with respect to the P-type silicon substrate 201, and $SW_{INT}$ is a switch for indicating that $D_{INT}$ underwent breakdown when it is closed.

$C_{S2}$ and $D_2$ are respectively the capacity and the P-N junction diode between the P-type silicon substrate 201 and the input pin 103 due to the protective circuit 104-1, and $SW_4$ is a switch for indicating that the diode $D_2$ is energized when it is closed.

First, assume that the switch $SW_1$ is closed to let a current flow from the external power supply pin 101 to the input pin $103_{IN}$ and the static electricity is discharged. In this case, it is considered that first $SW_3$ is closed, then $SW_2$ is closed. The reason for this is that although the breakdown voltage of the diode $D_1$ is designed to be fairly high, for example, at higher than 45 V, the clamping voltage of the clamping element can be designed to be at still lower value. After closure of $SW_3$, $SW_2$ and $SW_4$ are closed sequentially. Although the breakdown voltages of $D_1$ and $D_{INT}$ may be considered nearly the same, one may say that $SW_2$ is closed earlier than SWINT because of the fact that $SW_3$ is inserted between them and CINT has a large capacity.

As in the above, when $SW_3$ is closed, distribution of the charge takes place, and the current value is reduced accordingly. Therefore, the electrostatic withstand voltage is improved compared with an LVIC lacking $SW_2$.

When a MOSFET Mp (protective function is given to it by increasing the channel width) is inserted between the external power supply wiring 106 and an output pin $103_{OUT}$, it will seem at a glance that the effect of this invention does not apply to the electrostatic withstand voltage between the external power supply pin 101 and the output pin $103_{OUT}$. However, the electrostatic withstand voltage of the output pin in the LVIC was inferior to that of an IC which does not have a V.C. On the other hand, the total length of the external power supply wiring is much smaller than that of the internal power supply wiring. Since the parasitic capacity is small accordingly, and there exists a parasitic resistance moreover, the parasitic impedance becomes high and, for some locations of the output pin, discharge of the electric charge took place through unexpected route prior to the normal functioning of the protective circuit, causing breakdown of the internal circuit. In this embodiment, by making arrangement so as to have the potective transistor MP operate at a time not later than the time at which the output transistor Mp operates, for example, by setting the channel length of MP to be smaller than that of Mp, it becomes possible to realize distribution of the electric charge and to improve the electrostatic withstand voltage for both input pin and output pin.

Figure 5:
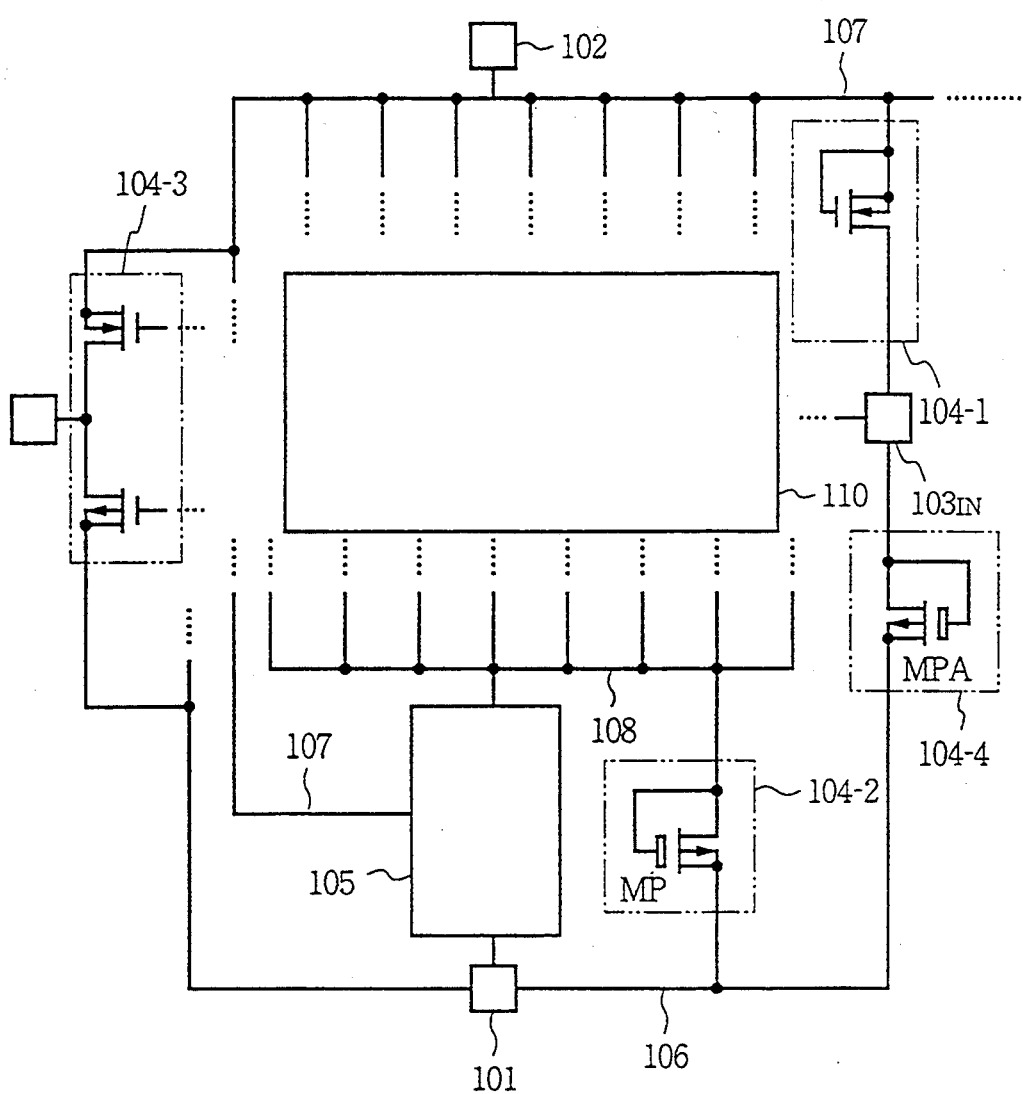
FIG. 5 is a schematic connection diagram showing a modification of the first embodiment.

In FIG. 5 is shown a modification of this embodiment. This is obtained by adding a protective circuit 104-4 between the input pin $103_{IN}$ and the external power supply wiring 106 of the first embodiment shown in FIG. 1. The protective circuit 104-4 consists of a P-channel MOSFET MPA which is essentially identical to MP. When an overvoltage positive with respect to the input pad $103_{IN}$ is applied to the external power supply pad 101, discharge takes place through energization of MPA. However, depending upon the location of the input pad $103_{IN}$ discharge took place through unexpected route prior to the formation of this discharge route. Nonetheless, the breakdown of the internal circuit 110 can be prevented even in such a case if there is provided the protective circuit 104-2. The provision of the protective circuit 104-4 might be said preferable in terms of the electrostatic withstand voltage, but it restricts the latitude of the IC design. In this respect the first embodiment is more advantageous.

Next, the second embodiment of the invention will be described.

Figure 6:
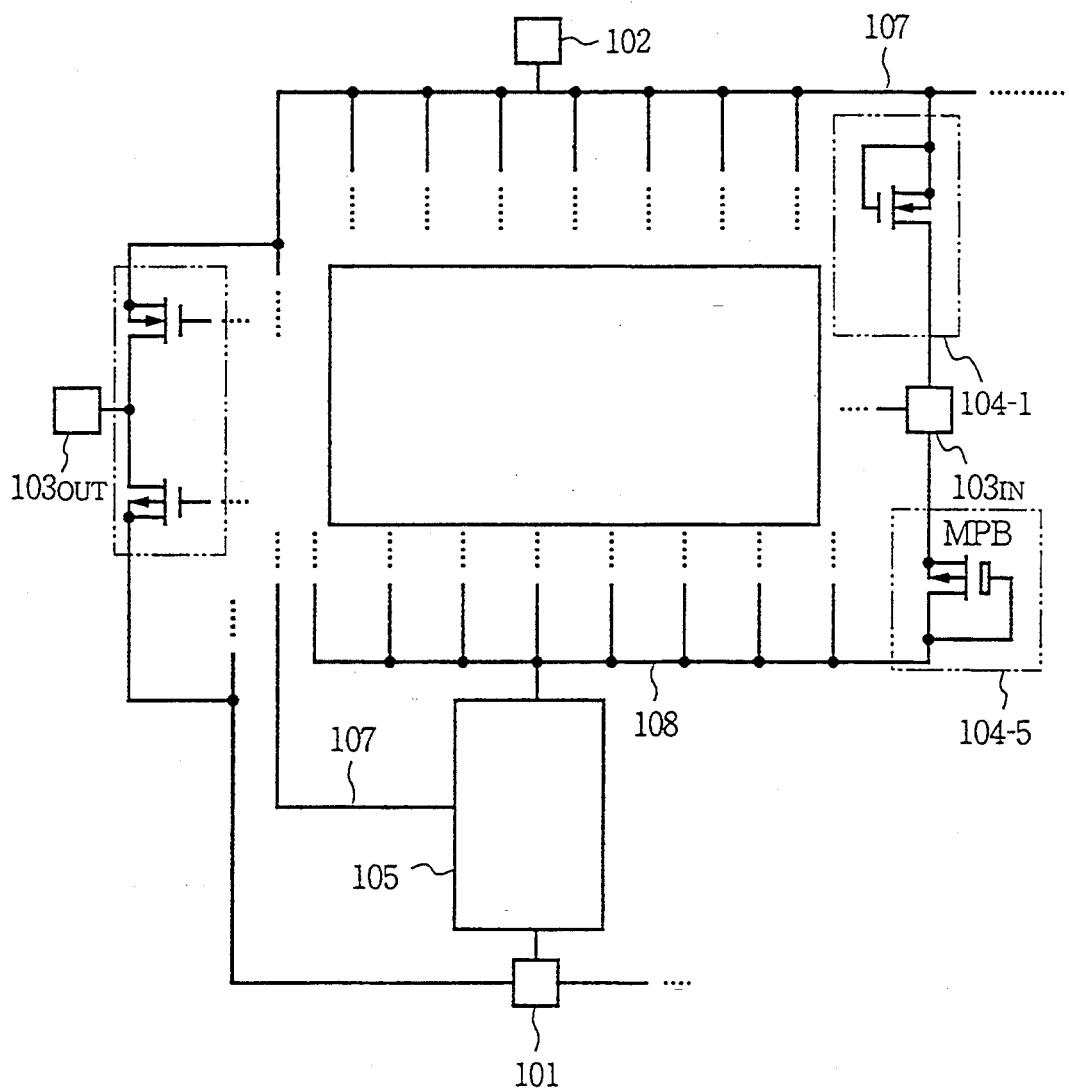
FIG. 6 is a schematic connection diagram showing a second embodiment of the invention.

Referring to FIG. 6, in this embodiment a protective circuit 104-5 is inserted between the input pin $103_{IN}$ and the internal power supply wiring 108. The protective circuit 104-5 is a P-channel field MOSFET similar to that of the protective circuit 104-2 of the first embodiment. In this embodiment the withstand voltage can be improved particularly when an overvoltage which is positive with respect to the external power supply pin 101 and similar other input pins is applied to the input pin $103_{IN}$.

Figure 7:
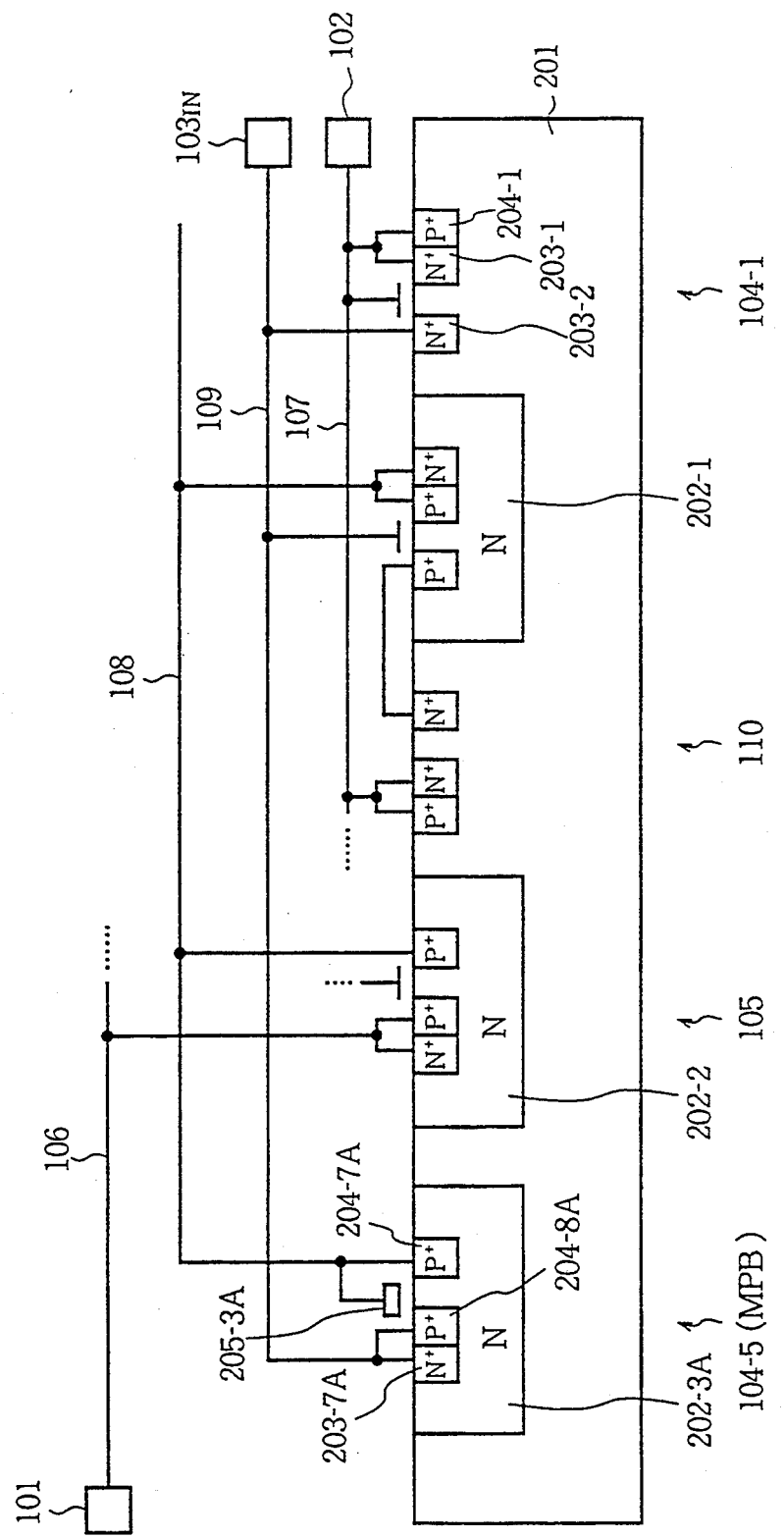
FIG. 7 is a schematic sectional diagram of a semiconductor chip for explaining the second embodiment.

Detailed description regarding the formation of this embodiment on a P-type silicon substrate will be omitted except for assigning corresponding reference numerals to components in FIG. 7, which is a schematic diagram similar to the cross sectional diagram FIG. 3, common to those of the first embodiment.

Figure 8:
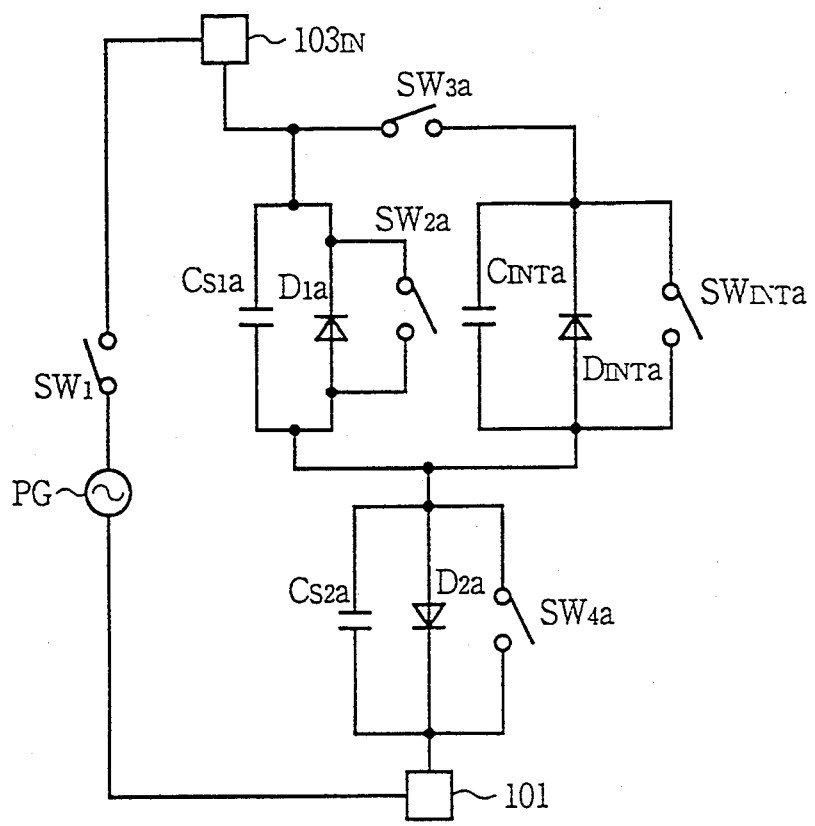
FIG. 8 is an equivalent circuit diagram of the second embodiment at the time of electrostatic withstand voltage test.

For the case of applying an overvoltage positive with respect to the external power supply wiring 101 to the input pin $103_{IN}$, the following explanation is possible In the equivalent circuit in FIG. 8, $C_{S1a}$ is the capacity between the input pin and the P-type silicon substrate 201 due to the protective circuit 104-1, $D_{1a}$ is the P-N junction diode between an N+-type diffused layer 203-2 and the P-type silicon substrate 201, $D_{INTa}$ and $C_{INTa}$ are the P-N junction diode and the capacity between an N well 202-3A and the P-type silicon substrate 201, respectively, and $D_{2a}$ and $C_{S2a}$ are the P-N junction and the capacity between an N well 202-2 and the P-type silicon substrate 201, respectively.

The clamping voltage of the protective circuit 104-5 is assumed to be designed not to exceed that of 104-1 in order for $SW_{3a}$ to be closed at the same time or earlier than $SW_{2a}$ does. With this arrangement, electric charge is distributed to $C_{INTa}$, so an improvement of the electrostatic withstand voltage will become understandable.

Between two arbitrary input pins that are equipped with a similar protective circuit, it is possible to consider an equivalent circuit similar to that in FIG. 8 since there appear, as seen from each of the input pins, two diodes $D_{INTa}$ connected in series in the opposite direction with respect to the other input pin.

By the insertion of a similar protective circuit between the output pin $103_{OUT}$ and the internal power supply wiring, a similar effect can be obtained. By the insertion of a similar protective circuit for both of the input pin and the output pin, it is possible to improve the electrostatic withstand voltage between the input pin and the output pin.

In the above, the present invention has been described assuming that the protective circuit to be inserted to the internal power supply wiring is a P-channel field MOSFET. However, it may be replaced by an N-channel field MOSFET. In that case, the gate electrode needs only he connected on the side of the external power supply wiring or the input pin, opposite to the case of the P-channel type.

Furthermore, it will be obvious to those skilled in the art that the protective circuit can be constructed by using a component similar to $BV_{DS}$ inserted between the input pad and the ground wiring or a clamping element such as a punch through transistor.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that appended claims will cover any modifications or embodiments as fall within the true scope of the invention.

What is claimed is:

1. A semiconductor integrated circuit device comprising:
    a power supply voltage conversion circuit connected between an external power supply wiring and a ground wiring for generating a predetermined internal power supply voltage at an output terminal thereof, said predetermined internal power supply voltage being smaller in absolute value than an external power supply voltage supplied between said external power supply wiring and said ground wiring;
    an internal power supply wiring connected to said output terminal of said power supply voltage conversion circuit;
    an internal circuit connected between said ground wiring and said internal power supply wiring;
    a first protective circuit connected between an input pad and said ground wiring; and
    a second protective circuit connected between said internal power supply wiring and at least one of said input pad and said external power supply wiring.

2. A semiconductor integrated circuit device as claimed in claim 1, wherein said second protective circuit comprises a clamping element.

3. A semiconductor integrated circuit device as claimed in claim 2, wherein the clamping element is a field MOSFET.

4. A semiconductor integrated circuit device comprising:
    a semiconductor substrate;
    an external power supply wiring formed on said semiconductor substrate and supplied with an external power supply voltage;
    an internal power supply wiring formed on said semiconductor substrate;
    a ground wiring formed on and electrically connected to said semiconductor substrate;
    a power supply conversion circuit connected between said external power supply wiring and said internal power supply wiring and generating an internal power supply voltage on said internal power supply wiring, said internal power supply voltage being smaller in absolute value than said external power supply voltage supplied to said external power supply wiring, said power supply conversion circuit including a plurality of first MOSFETs each having source and drain regions selectively formed in said semiconductor substrate with interventions of respective PN junctions therebetween;

an internal circuit connected to said internal power supply wiring and operating on said internal power supply voltage, said internal circuit includes a plurality of second MOSFETs each having source and drain regions selectively formed in said semiconductor substrate with interventions of respective PN junctions therebetween;

an input pad connected to said internal circuit to supply an input signal thereto;

a first protective element connected between said input pad and said ground wiring and having a diffusion region selectively formed in said semiconductor substrate with an intervention of a PN junction therebetween; and a second protective element connected between said internal power supply wiring and said external power supply wiring and having a diffusion region selectively formed in said semiconductor substrate with an intervention of a PN junction therebetween, wherein when an overvoltage is applied to said external power supply wiring with respect to said input pad, said second protective element is rendered conductive to transfer said overvoltage to said internal power supply wiring so that a current due to said overvoltage flows into said semiconductor substrate through the respective regions of said first and second MOSFETs and then reaches said input pad through the diffusion region of said first protective element.

5. A semiconductor integrated circuit device as claimed in claim 4, wherein said semiconductor substrate is of p-type conductivity, said second protective element includes a p-channel MOSFET formed in a n-type well formed in said semiconductor substrate;

said p-channel MOSFET comprising a source electrode, a drain electrode and a gate electrode, either one of said source electrode or said drain electrode being connected to said internal power supply wiring, the other one of said source electrode or said drain electrode connected to said external power supply wiring, and said gate electrode connected to said internal power supply wiring.

6. A semiconductor integrated circuit device as claimed in claim 4, wherein said semiconductor substrate is of n-type conductivity, said second protective element includes a n-channel MOSFET formed in a p-type well formed in said semiconductor substrate;

said n-channel MOSFET comprising a source electrode, a drain electrode and a gate electrode, either one of said source electrode or said drain electrode being connected to said internal power supply wiring, the other one of said source electrode or said drain electrode connected to said external power supply wiring, and said gate electrode connected to said external power supply wiring.

7. A semiconductor integrated circuit device comprising:

a semiconductor substrate;

an external power supply wiring formed on said semiconductor substrate and supplied with an external power supply voltage;

an internal power supply wiring formed on said semiconductor substrate;

a ground wiring formed on and electrically connected to said semiconductor wiring;

a power supply conversion circuit connected between said external power supply wiring and said internal power supply wiring and generating an internal power supply voltage on said internal power supply wiring, said internal power supply voltage being smaller in absolute value than said external power supply voltage supplied to said external power supply wiring, said power supply conversion circuit including a plurality of first MOSFETs each having source and drain regions selectively formed in said semiconductor substrate with interventions of respective PN junctions therebetween;

an internal circuit connected to said internal power supply wiring and operating on said internal power supply voltage, said internal circuit including a plurality of second MOSFETs each having source and drain regions selectively formed in said semiconductor substrate with interventions of respective PN junctions therebetween;

an input pad connected to said internal circuit to supply an input signal thereto;

a first protective element connected between said input pad and said ground wiring and having a diffusion region selectively formed in said semiconductor substrate with an intervention of a PN junction therebetween; and a second protective element connected between said internal power supply wiring and said input pad and having a diffusion region selectively formed in said semiconductor substrate with an intervention of a PN junction therebetween, wherein when an overvoltage is applied to said input pad with respect to said external power supply wiring, said second protective element is rendered conductive to transfer said overvoltage to said internal power supply wiring so that current due to said overvoltage flows into said semiconductor substrate through the respective regions of said second MOSFETs and said first protective element and then reaches said external power supply wiring through the respective regions of said first MOSFETs.

8. A semiconductor integrated circuit device as claimed in claim 5, wherein said semiconductor substrate is of p-type conductivity, said second protective element includes a p-channel MOSFET formed in a n-type well formed in said semiconductor substrate;

said p-channel MOSFET comprising a source electrode, a drain electrode and a gate electrode, either one of said source electrode or said drain electrode being connected to said internal power supply wiring, the other one of said source electrode or said drain electrode connected to said input pad, and said gate electrode connected to said input pad.

9. A semiconductor integrated circuit device as claimed in claim 5, wherein said semiconductor substrate is of n-type conductivity, said second protective element includes a n-channel MOSFET formed in a p-type well formed in said semiconductor substrate;

said n-channel MOSFET comprising a source electrode, a drain electrode and a gate electrode, either one of said source electrode or said drain electrode being connected to said internal power supply wiring, the other one of said source electrode or said drain electrode connected to said input pad, and said gate electrode connected to said input pad.

* * * * *